United States Patent
Milewski et al.

(10) Patent No.: US 6,330,967 B1
(45) Date of Patent: *Dec. 18, 2001

(54) PROCESS TO PRODUCE A HIGH TEMPERATURE INTERCONNECTION

(75) Inventors: Joseph M. Milewski, Kirkwood; Charles G. Woychik, Vestal, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/815,656

(22) Filed: Mar. 13, 1997

(51) Int. Cl.⁷ .......................... B23K 31/02; H01L 29/40; H01L 21/44
(52) U.S. Cl. .................. 228/180.22; 228/246; 257/737; 257/738; 438/613; 438/614
(58) Field of Search .................... 228/179.1, 180.1, 228/246, 180.21, 180.22, 254; 257/737, 738; 438/613, 614, 615

(56) References Cited

U.S. PATENT DOCUMENTS

| | | | |
|---|---|---|---|
| 4,545,610 | * 10/1985 | Lakritz et al. | 29/589 |
| 5,060,844 | 10/1991 | Behun et al. . | |
| 5,075,965 | * 12/1991 | Carey et al. | 29/840 |
| 5,161,729 | * 11/1992 | Dunaway et al. | 228/179 |
| 5,221,038 | * 6/1993 | Melton et al. | 228/180.2 |
| 5,234,152 | * 8/1993 | Glaeser | 228/121 |
| 5,372,298 | * 12/1994 | Glaeser | 228/195 |
| 5,429,292 | * 7/1995 | Melton et al. | 228/180.22 |
| 5,470,787 | * 11/1995 | Greer | 437/183 |
| 5,473,814 | * 12/1995 | White | 29/840 |
| 5,580,668 | * 12/1996 | Kellam | 428/610 |
| 5,591,941 | * 1/1997 | Acocella et al. | 174/266 |
| 5,634,268 | * 6/1997 | Dalal et al. | 29/840 |
| 5,639,696 | * 6/1997 | Liang et al. | 437/209 |
| 5,675,889 | * 10/1997 | Acocella et al. | 29/830 |
| 5,729,896 | * 3/1998 | Dalal et al. | 29/840 |
| 5,796,591 | * 8/1998 | Dalal et al. | 361/779 |
| 5,808,853 | * 9/1998 | Dalal et al. | 361/306.1 |
| 5,825,629 | * 10/1998 | Hoebener et al. | 361/777 |
| 5,912,505 | * 6/1999 | Itoh et al. | 257/737 |
| 5,953,623 | * 9/1999 | Boyko et al. . | |
| 5,965,945 | * 10/1999 | Miller et al. | 257/781 |
| 6,121,069 | * 9/2000 | Boyko et al. . | |
| 6,130,476 | * 10/2000 | LaFontaine, Jr. et al. | 257/678 |
| 6,162,660 | * 12/2000 | LaFontaine, Jr. et al. . | |

OTHER PUBLICATIONS

Metals Handbook vol. 8, 8th Ed., p. 330, 1973.*

IBM Technical Disclosure Bulletin NN950419, Apr. 1, 1995.*

\* cited by examiner

*Primary Examiner*—M. Alexandra Elve
*Assistant Examiner*—Kiley Stoner
(74) *Attorney, Agent, or Firm*—Ratner & Prestia; Lawrence R. Fraley, Esq.

(57) ABSTRACT

A solder interconnection uses preferably lead-rich solder balls for making a low temperature chip attachment directly to any of the higher levels of packaging substrate. After a solder ball has been formed using standard processes, a thin cap layer of preferably pure tin is deposited on a surface of the solder balls. An interconnecting eutectic alloy is formed upon reflow. Subsequent annealing causes tin to diffuse into the lead, or vice versa, and intermix, thereby raising the melting point temperature of the cap layer of the resulting assembly. This structure and process avoids secondary reflow problems during subsequent processing.

4 Claims, 3 Drawing Sheets

PROCESS TO PRODUCE A HIGH TEMPERATURE INTERCONNECTION

FIELD OF THE INVENTION

The present invention relates in general to a process and structure for adhering a material to a supporting substrate. In particular, the present invention describes a fabrication process and structure for attaching a chip or other substrate having a ball grid array to a chip carrier or printed circuit board.

BACKGROUND OF THE INVENTION

An electronic circuit contains many individual electronic circuit components, e.g., thousands or even millions of individual resistors, capacitors, inductors, diodes, and transistors. These individual circuit components are interconnected to form circuits, and the circuits are interconnected to form functional units. Microelectronic packages, such as chips, modules, circuit cards, circuit boards, and combinations thereof, are used to protect, house, cool, and interconnect circuit components and circuits.

Within a single integrated circuit (IC), circuit component to circuit component and circuit to circuit interconnection, heat dissipation, and mechanical protection are provided by an integrated circuit chip. The chip that is enclosed within its module is referred to as the first level of packaging.

There is at least one further level of packaging. The second level of packaging is a circuit card. A circuit card performs at least four functions. First, the circuit card is used if the total required circuit or bit count to perform a desired function exceeds the bit count of the first level package, i.e., the chip. Second, the second level package, i.e., the circuit card, provides a site for components that are not readily integrated into the first level package, i.e., the chip or module. These components include, e.g., capacitors, precision resistors, inductors, electromechanical switches, optical couplers, and the like. Third, the circuit card provides for signal interconnection with other circuit elements. Fourth, the second level package provides for thermal management, i.e., heat dissipation.

The industry has moved away from the use of pins as connectors for electronic packaging due to the high cost of fabrication, the unacceptable percentage of failed connections which require rework, the limitations on input/output (I/O) density, and the electrical limitations of the relatively high resistance connectors. Solder balls are superior to pins in all of the above features as well as being surface mountable, which has obvious implications given the increasingly small dimensions in the forefront technologies today.

Solder mounting is not a new technology. The need remains to improve the solder systems and configurations, however, in electronic structures. The use of solder ball connectors has been applied to the mounting of integrated circuit chips using the so-called "flip-chip" or controlled collapse chip connection (C4) technology. Many solder structures have been proposed to mount integrated circuit chips, as well as to interconnect other levels of circuitry and associated electronic packaging.

The basic structure is that of a minute solder portion, generally a ball, connected to a bonding site on one of the parts to be electrically joined. The assembly of the part, bonding pad, and solder is then brought into contact with a solderable pad on a second part and the solder is reflowed to achieve the connection. One of the major drawbacks of this configuration is that the solder balls do not always remain in place before connection, during processing, or upon rework. During rework, not only the solderable pad, but also the solder itself, becomes molten. There is no guarantee, therefore, that the solder will remain associated with the first part during heating in subsequent processing.

To handle a large number of I/O's per chip, various "flip chip" bonding methods have been developed. In these so-called "flip chip" bonding methods, the face of the IC chip is bonded to the card.

Flip chip bonding allows the formation of a pattern of solder bumps on the entire face of the chip. In this way, the use of a flip chip package allows full population area arrays of I/O. In the flip chip process, solder bumps are deposited on solder wettable terminals on the chip and matching footprints of solder wettable is terminals are provided on the card. The chip is then turned upside down, hence the name "flip chip," the solder bumps on the chip are aligned with the footprints on the substrate, and the chip-to-card joints are all made simultaneously by the reflow of the solder bumps.

The wettable surface contacts on the card are the "footprint" mirror images of the solder balls on the chip I/O's. The footprints are both electrically conductive and solder wettable. The solder wettable surface contacts forming the footprints are formed by either thick film or thin film technology. Solder flow is restricted by the formation of dams around the contacts. The chip is aligned, for example self-aligned, with the card, and then joined to the card by thermal reflow. The assembly of chip and card is then subject to thermal reflow in order to join the chip to the card.

When the packaging process uses organic carriers (e.g., laminates, teflon, and flex), the first level flip chip attach process must be performed at low temperature. Although it would seem that a low temperature flip chip would be desirable, this is not the case because the first level interconnection would reflow during subsequent second level attach (assuming a laminate chip carrier). It is well known that the amount of molten solder in this type of flip chip interconnection can cause reliability problems, such as severe delamination.

A representation of the general arrangement of an unassembled package 1 is shown in FIG. 1. This package 1 includes an IC chip 10 and a card 21 to be joined by C4 bonding. Solder bumps 30 are present on the I/O leads 11 of the IC chip 10. The solder bumps 30 on the IC chip 10 correspond to recessed lands 151 on the circuit card 21.

A cutaway view of the assembled microelectronic circuit package 1 is shown in FIG. 2. FIG. 2 shows an IC chip 10 mounted on a circuit card 21. The IC chip 10 is electrically connected and metallurgically bonded to the circuit card 21 by the solder joints 32. FIG. 2 also shows the internal circuitry of the card 21, for example through holes and vias 23, and signal planes and power planes 25.

FIG. 3 is a cutaway view of an IC chip 10 and card 21 with a reflowed solder ball connector 31. This structure is representative of the prior art. The IC chip 10 has an array of I/O leads 11, i.e., contacts 12 on the internal leads 13. The individual contacts 12 are surrounded by a passivation layer 14. Recessed within the passivation layer 14 is the ball limiting metallurgy (BLM) which comprises, for example, metallization layers of chromium (Cr) and copper (Cu) 15, and a flash layer 16, e.g., a gold (Au) flash layer 16. Extending outwardly from the chip 10 is the solder ball 30. The solder ball 30 has a characteristic spherical shape because it has been reflowed. The circuit card 21 has a eutectic lead/tin (Pb/Sn) coated in land 151.

Although the art of semiconductor chip to supporting substrate connections and packaging is well developed, there remain problems inherent in this technology, as described above. Therefore, a need exists for a process and structure for increasing the reliability and decreasing the complexity of fabrication of the connection between an area array package and a supporting substrate.

SUMMARY OF THE INVENTION

The present invention provides a process and structure for increasing the reliability of the connection between an area array package and a supporting substrate by providing a thin layer of Sn on the end of a Pb-rich ball, reflowing to form a eutectic interconnection, and annealing to diffuse the Sn into the Pb.

According to one aspect of the present invention, a ball comprising Pb is deposited on solder wettable input/output (I/O) terminals of an IC chip; a layer of Sn having a thickness of preferably less than 10.2 $\mu$m (0.4 mils) is deposited on the exposed surface of the ball; the ball on the IC chip is aligned with corresponding solder wettable I/O terminals or footprints on a microelectronic circuit card; the layer of Sn is reflowed to form a Pb/Sn eutectic alloy (37/63 weight percent Pb/Sn) at the interface between the layer of Sn and the surface of the Pb-rich ball to bond the chip to the microelectronic circuit card; and the Pb/Sn eutectic alloy is heated or annealed for a predetermined time at a predetermined temperature to diffuse Sn from the eutectic alloy into the Pb-rich interior, or vice versa.

According to another aspect of the present invention, the predetermined temperature is preferably about 150° C. and the predetermined time is between about 4 and 5 hours. According to still another aspect of the present invention, the step of heating or annealing causes the eutectic alloy to diffuse Sn into the Pb-rich interior such that the resulting composition of the assembly initially comprising the eutectic alloy and the Pb-rich interior is 97/3 weight percent Pb/Sn. In a further aspect of the present invention, the solder wettable I/O terminals on the microelectronic circuit card are copper (Cu).

According to yet another aspect of the present invention, a ball comprising Pb is deposited on solder wettable I/O terminals of an IC chip; a layer of Sn having a thickness of preferably less than 10.2 $\mu$m (0.4 mils) is deposited on solder wettable I/O terminals or footprints on a microelectronic circuit card; the ball on the IC chip is aligned with a layer of Sn on the corresponding footprints on the microelectronic circuit card; the layer of Sn is reflowed to form a Pb/Sn eutectic alloy (37/63 Pb/Sn), beginning at the Pb—Sn interface and continually consuming Sn from the Sn cap layer, and a Pb-rich interior, to bond the chip to the microelectronic circuit card; and the Pb/Sn eutectic alloy is heated or annealed for a predetermined time at a predetermined temperature to diffuse Sn from the eutectic alloy and any remaining Sn from the Sn layer into the Pb-rich interior, or vice versa.

The foregoing and other aspects of the present invention will become apparent from the following detailed description of the invention when considered in conjunction with the accompanying drawings.

DESCRIPTION OF EXEMPLARY EMBODIMENTS AND BEST MODE

The present invention is directed to a process and structure for adhering a material to a supporting substrate. The present invention is used to join semiconductor chips, such as ball grid array (BGA) modules and flip chips, to a substrate, such as a printed circuit board (PCB), a microelectronic circuit card, or any organic or ceramic chip carrier or organic circuit board. A thin cap layer of a low melting point metal or alloy, preferably tin (Sn), is reflowed to form a eutectic alloy and annealed with a high melting point ball, preferably lead-rich. Sn and lead (Pb) will be used as the preferred materials in the following description of the embodiments, but any low melting point and high melting point eutectic system can be used. The annealing causes Sn from the eutectic alloy and any remaining unconsumed Sn from the thin cap layer of Sn to diffuse into the Pb in the ball, or vice versa, and thereby increase the melting temperature of the interconnection. This prevents reflow during subsequent processing and prevents the interconnection from melting again during further processing (this type of "secondary reflow" is known to cause many problems).

Figure 1:
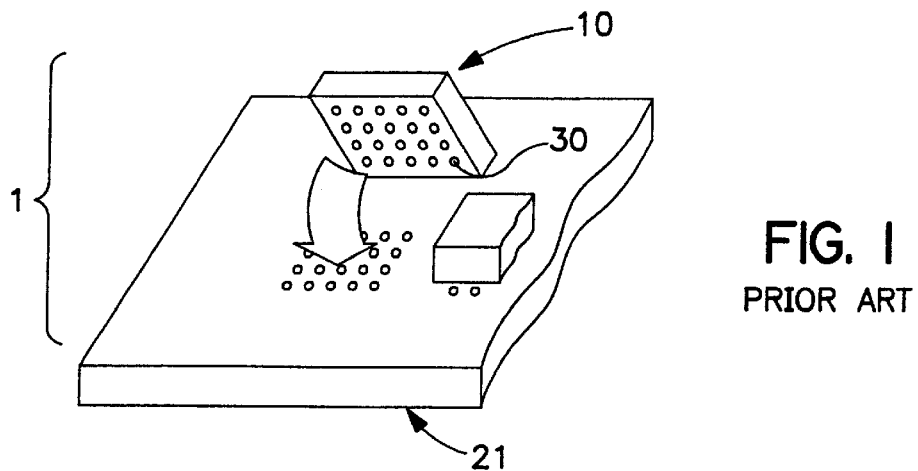
FIG. 1 is a representation of a conventional arrangement of an IC chip, a card, including the solder bumps on the I/O's of the IC chip, and corresponding recessed lands on the card.
Figure 2:
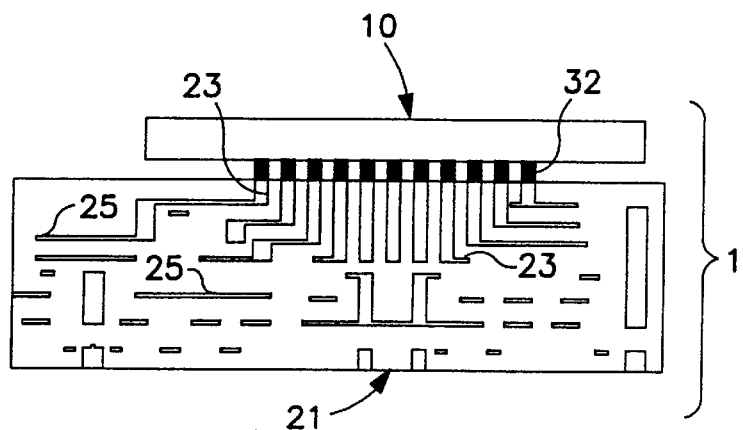
FIG. 2 is a cutaway view of an IC chip mounted on a card, showing the solder joints between the IC chip and the card, and the internal circuitry of the card.
Figure 3:
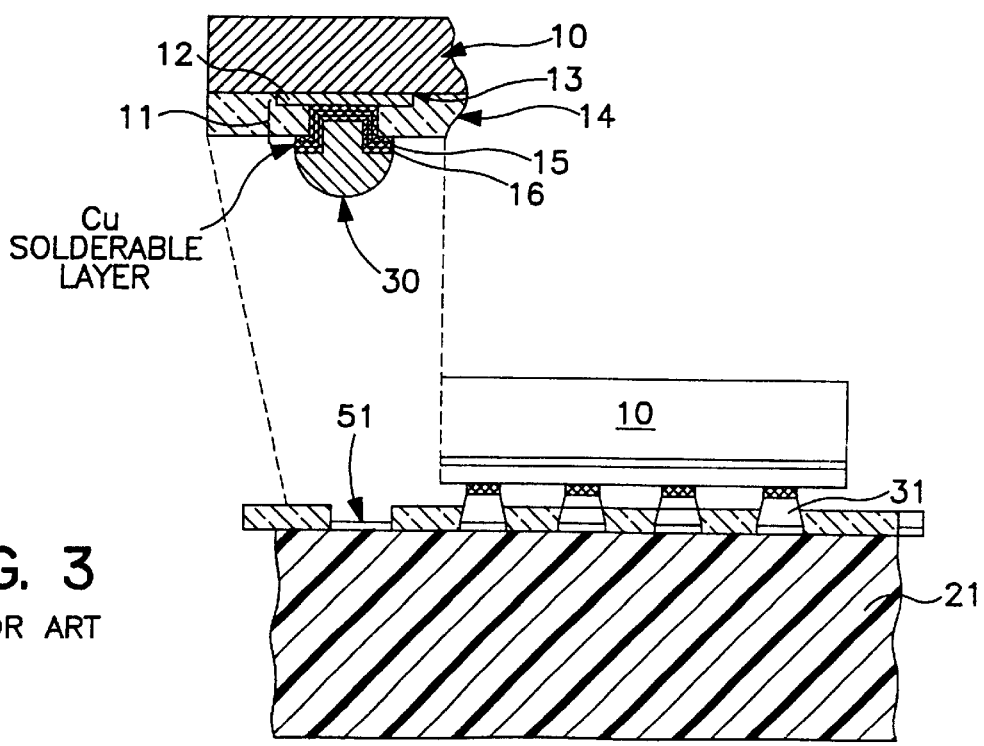
FIG. 3 is a cutaway view of an IC chip and card with a reflowed solder ball connector representative of the prior art.
Figure 4:
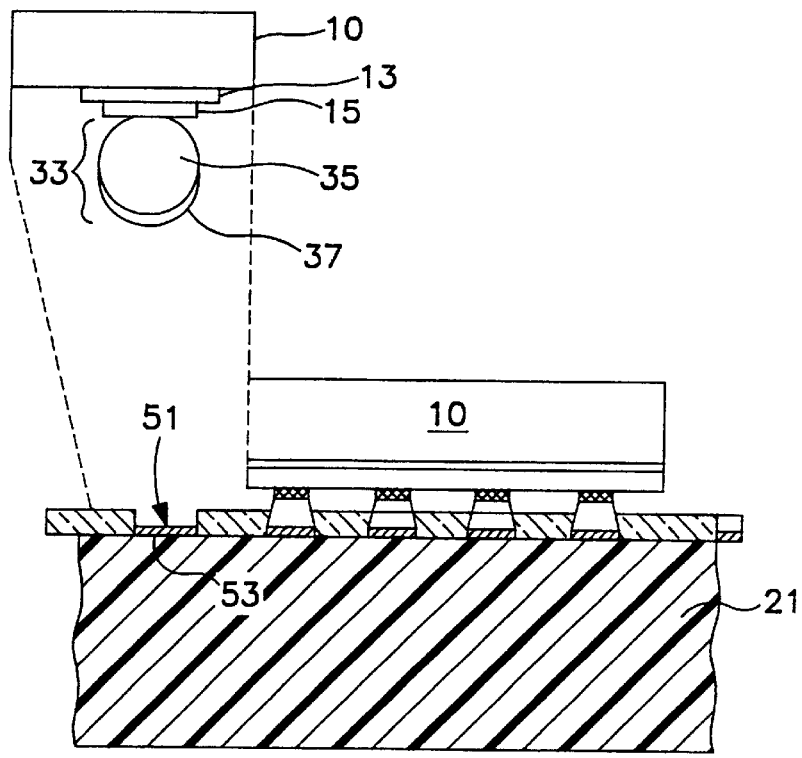
FIG. 4 is a cutaway view of an IC chip and card with a non-reflowed solder assembly in accordance with a first embodiment of the present invention.

The structure of an integrated circuit (IC) chip 10 and a microelectronic circuit card 21 of the first embodiment of the present invention is shown in FIG. 4. FIG. 4 is a cutaway view of an IC chip 10 and card 21, with a nonreflowed solder assembly 33, and a land 53 on which an adhesion or joining pad 51, preferably copper (Cu), is placed. The solder assembly 33 comprises a low melting point cap 37 formed atop a high melting point ball 35. The low melting point cap is preferably Sn, but other low melting point materials such as indium or bismuth can be used.

The high melting point ball 35, preferably Pb-rich, is deposited on solder wettable input/output (I/O) terminals 15 of an IC chip 10 or a chip carrier or other substrate. The Pb-rich balls are formed by a conventional process and affixed to the IC chip 10 in a conventional manner. A thin cap of Sn 37 is formed on the end of the ball 35. The Sn cap 37 can be applied to the Pb-rich ball 35 using any conventional process. The thickness of the cap 37 is preferably less than 10.2 $\mu$m (0.4 mils). A thicker layer of Sn does not diffuse easily. Thus, a relatively Pb-rich core or ball 35 and a relatively Sn-rich cap 37 are formed. The IC chip 10 has an array of contacts/internal leads 13. An adhesion layer of I/O terminals 15 is used to bond the solder assembly 33 to the IC chip 10. Extending outwardly from the IC chip is the solder assembly 33. The solder assembly 33 has not yet been reflowed, melted, or remelted.

A matching footprint of solder wettable I/O terminals or adhesion pads 51 is provided on a microelectronic circuit card 21. The solder wettable I/O terminals or adhesion pads 51 are substantially free of deposited solder alloy, and are preferably a Cu surface 51, or optionally a surface of Cu and an oxidation inhibitor. The Cu pads 51 on the lands 53 of the circuit card 21 correspond to the solder assemblies 33 on the IC chip 10.

Figure 5A:
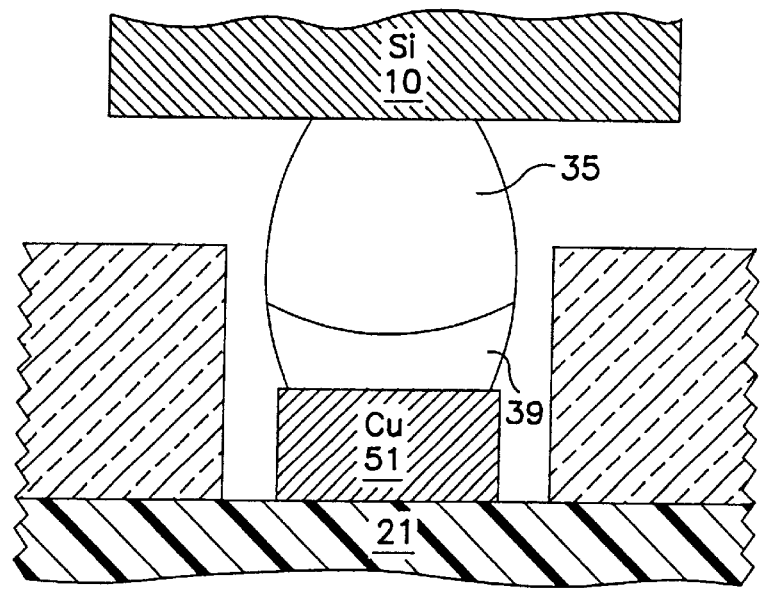
FIG. 5A is a schematic representation of the IC chip, solder assembly, and card land of FIG. 4 after melting and connecting (reflowing) and before annealing.

The solder assemblies 33 on the chip 10 are aligned with the corresponding Cu adhesion pads 51 on the lands 53 on the microelectronic circuit card 21. The Sn, which has a low melting point, is reflowed to bond the Pb-rich ball to the PCB contact. FIG. 5A is a schematic representation of the IC chip 10, with the solder assembly 33, including the Pb-rich ball 35 and the Sn-rich cap 37 after alignment, melting, and connecting. The solder assembly 33, which has not previously been reflowed, is reflowed to form a Pb/Sn eutectic 39 and bond the IC chip 10 to the microelectronic circuit card 21. The reflow is preferably performed at 220–240° C. for 80–120 seconds. The reflow is performed at a temperature greater than the Pb/Sn eutectic temperature (183° C.) to form zones and/or regions of Pb/Sn eutectic at the interface between the Sn layer 37 and the ball 35, thereby connecting the IC chip 10 to the microelectronic circuit card 21. Heating may be carried out by vapor phase, infrared (IR), or convection heating. Bonding occurs by the formation of the Pb/Sn eutectic alloy 39 at the interface between the Pb-rich ball 35 and the Sn-rich cap 37. The Sn-rich cap 37 interacts with the Pb-rich ball 35 of the solder assembly 33 to form the Pb/Sn eutectic 39. Preferably, the Sn is entirely consumed in this eutectic-forming process.

Initial joining is done at a low enough temperature so that the Pb-rich balls do not melt. Thus, the surface of the carrier has electrical features that are directly related to the low melting point metal on the solder ball of the chip to form the eutectic, thereby attaching the chip to the carrier.

The Pb/Sn eutectic 39 is preferably 37/63 weight percent Pb/Sn, and its formation is favored by the large amount of Sn in proximity to the Pb, that is, by Sn in the Sn-rich cap 37 in proximity to the Pb in the Pb-rich ball 35. The Sn-rich cap 37 serves as the Sn supply for eutectic formation, thereby obviating the need for a Pb/Sn electroplate on the pads 51. In a preferred embodiment, an anti-oxidant or corrosion inhibitor may be applied to the pads 51.

Figure 5B:
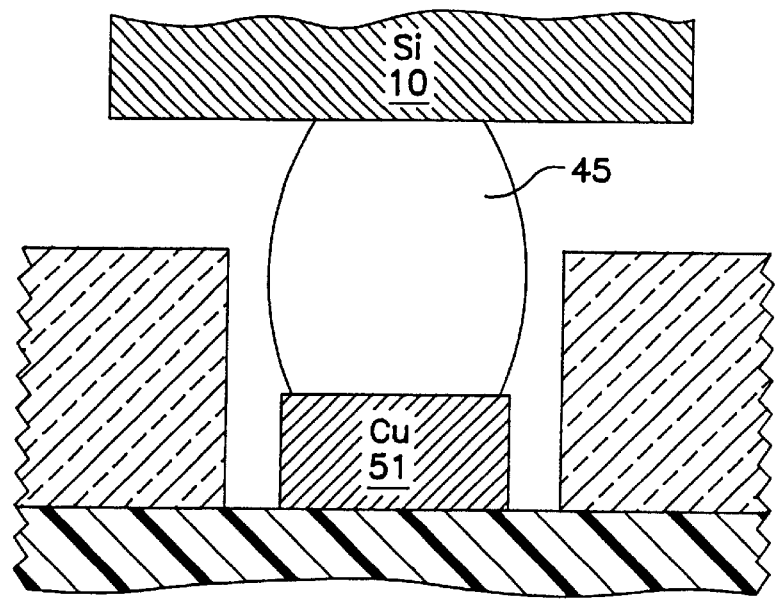
FIG. 5B is a schematic representation of the IC chip, solder assembly, and card land of FIG. 4 after annealing.

After the initial joining of the chip and carrier by reflow, the temperature is lowered, below the reflow temperature of the Sn, and the assembly comprising the Pb-rich ball 35 and the eutectic alloy 39 is annealed at a sufficient temperature, preferably 150° C., for a sufficient time, preferably 4–5 hours, to cause Sn from the eutectic alloy 39 to diffuse into the Pb-rich ball 35. FIG. 5B is a schematic representation of the IC chip 10, including the solder assembly 33, and the Cu adhesion pad 51 on the card land 53 of FIG. 5A after annealing the solder assembly 33. After the annealing, the Sn is diffused and intermixed throughout the Pb-rich interior such that the entire assembly 45 is Pb-rich, preferably about 97/3 Pb/Sn. This process increases the melting temperature of the cap of the assembly. Thus, reflow during subsequent processing is prevented.

It should be noted that annealing can also be performed to cause Pb from the Pb-rich ball 35 to diffuse into the eutectic alloy 39, thereby achieving the Pb-rich assembly 45. However, Pb diffuses into Sn more slowly than Sn diffuses into Pb, so it is preferable to diffuse the Sn from the eutectic alloy 39 into the Pb-rich ball 35.

Figure 6:
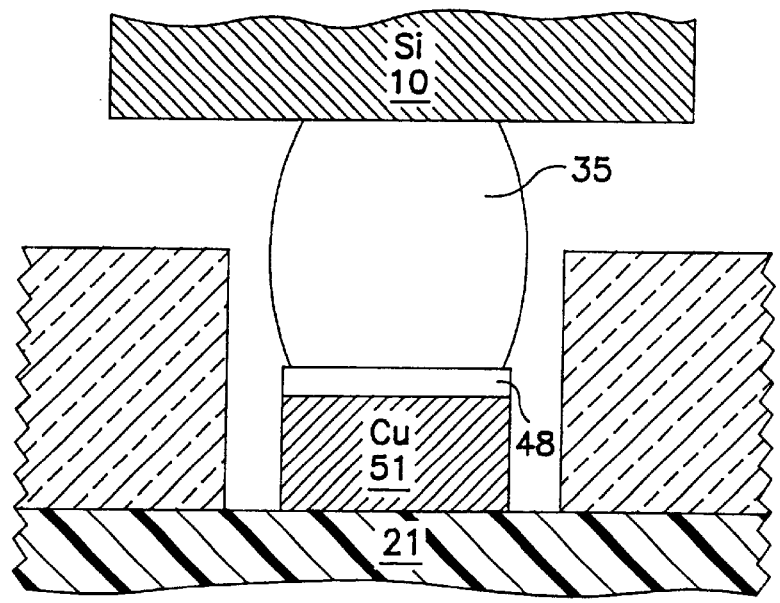
FIG. 6 is a schematic representation of an IC chip, solder assembly, and card land of a second embodiment of the present invention before melting and connecting (reflowing).

A second embodiment of the present invention is shown in FIG. 6. In FIG. 6, the Pb-rich ball 35 is attached to the IC chip 10 as in the first embodiment, but the ball 35 does not have a thin Sn cap layer. Instead, a thin layer of Sn 48 is formed on the Cu pad 51 on the land 53. The IC chip 10 with the ball 35 is brought into contact with the Sn layer 48 on the Cu pad 51 on the land 53 and heated to form the eutectic alloy. In other words, a thin Sn cap layer can be deposited onto the PCB contact and the Pb-rich ball (without the Sn cap layer) is pressed against the PCB contact. After the eutectic is formed, annealing is performed, preferably at 150° C. for 4–5 hours, to diffuse Sn into the Pb to increase the melting point of the cap layer of the resultant assembly, thus avoiding further unwanted melting during subsequent processing. Depending on the process parameters, some of the Sn may not be consumed in the eutectic and there may be a thin, high-percentage Sn layer (not shown) remaining between the eutectic and the Cu adhesion pads 51 on the microelectronic circuit card 21.

The above described process and structure can be used for many packaging platforms, including laminates, plastic ball grid array (PBGA), teflon, flex, and tape ball grid array (TBGA) packages, as well as other direct chip attach applications on a motherboard. Moreover, the above described process and structure can be used for any eutectic-like system, such as Pb/Au.

An advantage of using the process and structure of the present invention is that higher throughputs are attained. Moreover, in the case of TBGA, no gold (Au) plating is required. The present invention provides the advantage of a high volume process for assembly without the problem of secondary reflow. Finally, the amount of solder is very small in order to minimize the delamination problems described above.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A process of joining an integrated circuit (IC) chip to a microelectronic circuit card comprising the steps of:

depositing a ball comprising lead (Pb) on solder wettable input/output (I/O) terminals of said IC chip such that said ball has an exposed surface;

depositing a layer of gold (Au) having a thickness on the exposed surface of said ball;

providing a matching footprint of said solder wettable I/O terminals on said microelectronic circuit card;

aligning said layered ball on said IC chip with the corresponding footprint on said microelectronic circuit card;

heating said layer of Au at a temperature greater than a Pb/Au eutectic temperature to form a Pb/Au eutectic alloy on said ball to bond said IC chip to said microelectronic circuit card; and annealing said Pb/Au alloy at a predetermined temperature lower than the temperature of said reflowing step for a predetermined time to diffuse and intermix throughout the bond said Au from said Pb/Au alloy and said Pb from said ball, to increase melting temperature of the bond between said IC chip and said microelectronic circuit card.

2. The process of claim 1, wherein the thickness of said layer of Au is less than 10.2 μm (0.4 mils).

3. A process of joining an integrated circuit (IC) chip to a microelectronic circuit card comprising the steps of:

depositing a ball comprising lead (Pb) on solder wettable input/output (I/O) terminals of said IC chip such that said ball has an exposed surface;

depositing a layer of gold (Au) having a thickness on the exposed surface of said ball;

providing a matching footprint of said solder wettable I/O terminals on said microelectronic circuit card;

aligning said layered ball on said IC chip with the corresponding footprint on said microelectronic circuit card;

heating said layer of Au at a temperature greater than a Pb/Au eutectic temperature to form a Pb/Au eutectic alloy on said ball to bond said IC chip to said microelectronic circuit card; and annealing said Pb/Au alloy at a predetermined temperature lower than the temperature of said reflowing step for a predetermined time to diffuse and intermix throughout the bond said Au from said Pb/Au alloy and said Pb from said ball, to increase melting temperature of the bond between said IC chip and said microelectronic circuit card, wherein the step of heating diffuses substantially all of the Au in said Pb/Au eutectic alloy into said ball to form an assembly having a weight composition of about 85/15 Pb/Au.

4. A process of joining an integrated circuit (IC) chip to a microelectronic circuit card comprising the steps of:

depositing a ball comprising lead (Pb) on solder wettable input/output (I/O) terminals of said IC chip such that said ball has an exposed surface;

depositing a layer of gold (Au) having a thickness on the exposed surface of said ball;

providing a matching footprint of said solder wettable I/O terminals on said microelectronic circuit card;

aligning said layered ball on said IC chip with the corresponding footprint on said microelectronic circuit card;

heating said layer of Au at a temperature greater than a Pb/Au eutectic temperature to form a Pb/Au eutectic alloy on said ball to bond said IC chip to said microelectronic circuit card; and annealing said Pb/Au alloy at a predetermined temperature lower than the temperature of said reflowing step for a predetermined time to diffuse and intermix throughout the bond said Au from said Pb/Au alloy and said Pb from said ball, to increase melting temperature of the bond between said IC chip and said microelectronic circuit card;

wherein the predetermined temperature is 150° C. and the predetermined time is in the range between 4 and 5 hours.

* * * * *